US 6,588,710 B1

(12) United States Patent
Taylor (10) Patent No.: US 6,588,710 B1
(45) Date of Patent: Jul. 8, 2003

(54) RAILROAD TRACKWORK SWITCH POINT POSITION STATUS INDICATOR

(76) Inventor: Philip A. Taylor, 637 Dennison Ave., Columbus, OH (US) 43215

(*) Notice: Subject to any disclaimer, the term of this patent is extended or adjusted under 35 U.S.C. 154(b) by 0 days.

(21) Appl. No.: 10/199,282

(22) Filed: Jul. 19, 2002

(51) Int. Cl.[7] .................................. B61L 11/08
(52) U.S. Cl. ........................ 246/220; 246/476
(58) Field of Search .................... 246/218, 220, 246/264, 265, 415 R, 473 R, 476; 104/130.01

(56) References Cited

U.S. PATENT DOCUMENTS 4,986,498 A * 1/1991 Rotter et al. ............... 246/458
5,806,809 A * 9/1998 Danner ....................... 246/220
6,427,949 B1 * 8/2002 Hager et al. ................ 246/220
6,484,974 B1 * 11/2002 Franke et al. .............. 246/476

* cited by examiner

Primary Examiner—S. Joseph Morano
Assistant Examiner—Robert J. McCarry, Jr.
(74) Attorney, Agent, or Firm—Thomas S. Baker, Jr.

(57) ABSTRACT

The railroad trackwork switch assembly of the present invention is essentially comprised of a relatively fixed conventional stock rail, a conventional switch point relatively movable into and out of abutting engagement with the stock rail, a target magnetic field source array, a controller housing element affixed to the switch stock rail and containing a Hall-effect sensor array, and electrical/electronic circuitry interconnecting the invention Hall-effect sensor array element to a power source and to an external switch closure condition signal visual display.

47 Claims, 10 Drawing Sheets

RAILROAD TRACKWORK SWITCH POINT POSITION STATUS INDICATOR

CROSS-REFERENCES

None.

FIELD OF THE INVENTION

This invention relates generally to railroad trackwork switches, and particularly concerns sensor apparatus useful for detecting and indicating whether or not the switch point of a railroad trackwork switch is satisfactorily positioned with respect to the switch stock rail.

BACKGROUND OF THE INVENTION

Railroad trackwork hand-thrown switches conventionally make use of an electro-mechanical switch status circuit controller for the detection of the position of a switch point relative to the switch stock rail, and since the operation of such controller relies upon mechanical hardware connected to the rail it accordingly is subject in the course of railroad operations to mechanical damage and to the effects of temperature variations. The use of proximity sensing techniques and hardware in lieu of the state-of-the-art electro-mechanical control approach, if properly done, offers the potential of eliminating the mechanical damage and temperature variation short-comings associated with present railroad operations.

Accordingly, it is a principal object of the present invention to provide proximity sensing hardware that reliably indicates the operating status (i.e., "either satisfactory" switch closure or "unsatisfactory" switch closure) of a connected hand-thrown railroad trackwork switch.

Another object of the present invention is to provide proximity sensing hardware that is not adversely affected by temperature variations encountered in trackage in connection with typical railroad operations.

A still further object of the present invention is to provide proximity sensing hardware that is not "fooled" by the presence of stray metal or other detritus in the co-operating railroad trackwork switch assembly.

Another object of the present invention is to provide proximity sensing hardware for a railroad trackwork switch that may be conveniently maintained in the course of normal railroad operations. Other objects of the present invention will become apparent during consideration of the detailed description, drawings, and claims which follow.

SUMMARY OF THE INVENTION

The railroad trackwork switch assembly of the present invention is essentially comprised of a relatively fixed conventional stock rail, a conventional switch point that is relatively movable into and out of abutting engagement with the switch stock rail, a dual target magnetic field source array sub-assembly affixed to the switch point, a control box element containing dual Hall-effect sensor arrays and affixed to the switch stock rail, and electrical/electronic circuitry contained in the control box element and properly interconnecting the invention dual target magnetic field source array and dual Hall-effect sensor array elements with a power source and an external switch closure status condition signal generator.

The apparatus functions to generate a "true" control signal when the switch point is in a properly closed condition, and a "false" control signal whenever the switch point is unsatisfactorily positioned relative to the switch stock rail for a closed switch condition. The "false" control signal causes the external switch closure condition signal generator to display an observable condition indicator (e.g., a red light) meaning that applicable railroad operating restrictions are in effect.

DETAILED DESCRIPTION

Figure 1:
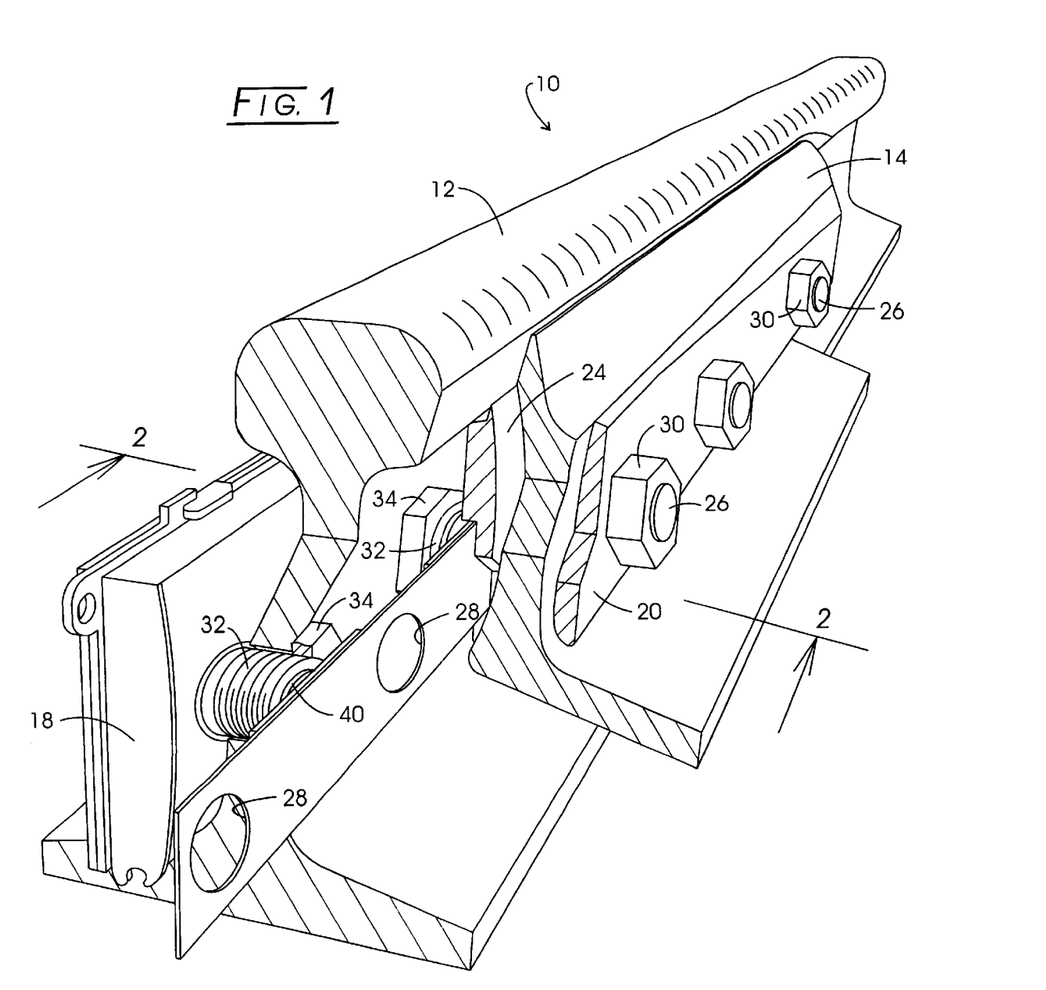
FIG. 1 is a schematic perspective view of a portion of a railroad trackwork switch illustrating the switch stock rail, switch point, and a preferred embodiment of the present invention incorporated therein.
Figure 2:
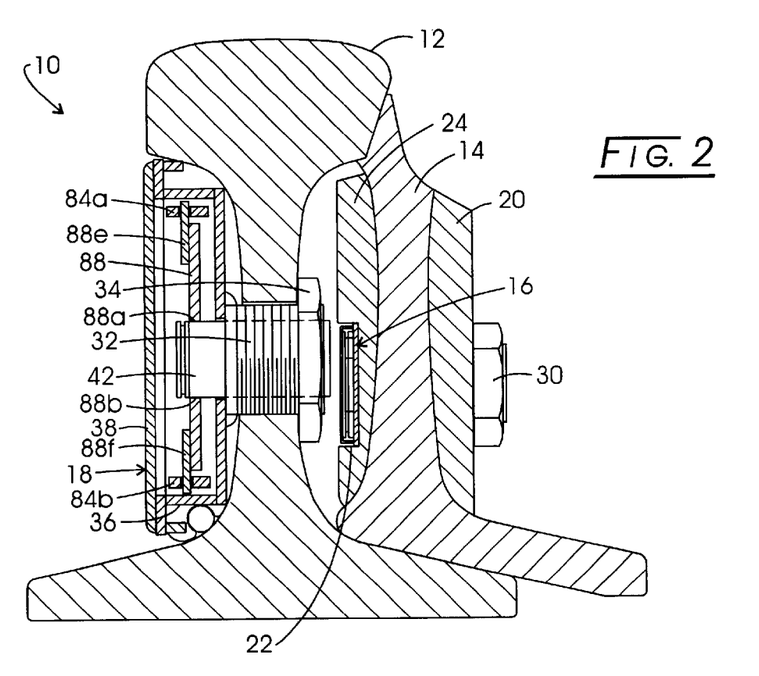
FIG. 2 is a section view taken at line 2—2 of FIG. 1.

In FIGS. 1 and 2 of the drawings I illustrate a portion and a section of an improved railroad trackwork switch assembly 10 which is principally comprised of stock rail 12, movable switch point 14, target sub-assembly 16 and controller sub-assembly 18. The stock rail has a fixed position whereas the switch point is movable relative to the stock rail both into and from an abutting condition. Attached to either side of switch point 14 are inside reinforcing strap 20 and outside reinforcing strap 24, the latter having a machined recess 22 that receives target sub-assembly 16. The reinforcing straps are joined to the web of switch point 14 by threaded bolts 26 which pass through bolt holes such as 28 in the switch rail web and in the target sub-assembly and are secured in position by threaded bolt nuts 30.

Controller sub-assembly 18 is secured in place on stock rail 12 by the co-operation of externally threaded sleeves 32 that are welded to the controller housing body 36 of the controller sub-assembly and a co-operating threaded sleeve nut 34. The controller sub-assembly housing removable cover shown is designated 38. Also, contained within controller housing body/cover combination are dual sensor sub-assemblies 40 and 42 as well as the hereinafter-mentioned electrical/electronic circuitry that receives, as inputs, the outputs of sensor sub-assemblies 40 and 42 that develop resulting "true" and/or "false" control signals. Controller sub-assembly 18 incorporates two sensor sub-assemblies 40 and 42 each having identical outputs for redundancy purposes and to ensure that at least one is functioning when the other is being adjusted as described hereinafter.

Figure 3:
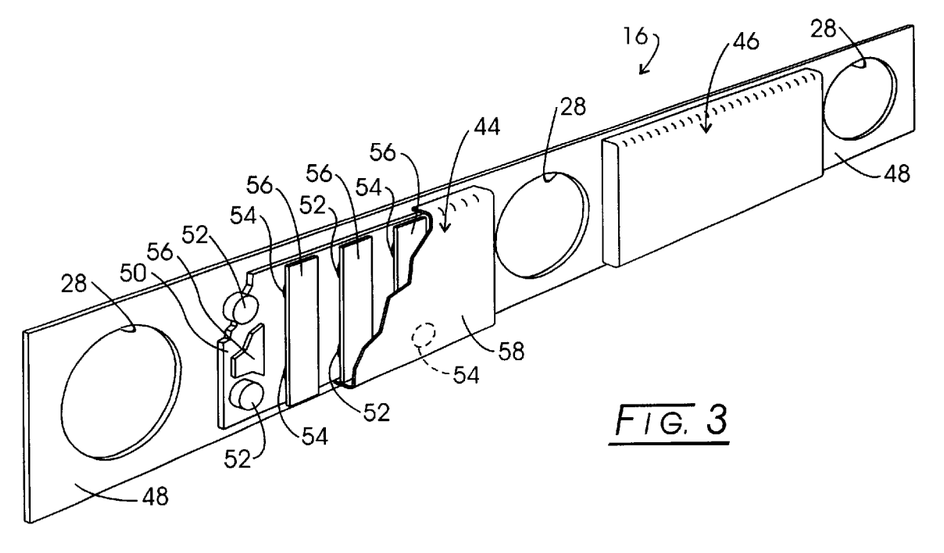
FIG. 3 is a perspective view of the dual target sub-assembly of the present invention.

FIG. 3 illustrates target sub-assembly 16, such having identical dual magnetic targets 44 and 46 which are mounted on back plate 48 which preferably is made of a ferromagnetic metal such as steel or stainless steel. Targets 44 and 46 are aligned adjacent respective sensor sub-assemblies 40 and 42. Each of the dual magnetic targets 44 and 46 is principally comprised of a magnet retainer plate 50 secured to back plate 48 and an array of permanent magnets 52 and 54 combined in four pairs of alternating polarity and positioned and spaced-apart along the length of magnet retainer plate 50. The number of pairs of magnets 52 and 54 is not critical and may be more or less than four. Magnet 52 in each such pair has a south-to-north polarity orientation (as viewed from point outside to point inside) whereas magnet 54 of the pair has a reverse or north-to-south orientation as placed in retainer plate 50 so that their electromagnetic flux fields are effectively combined and reinforce each other. An individual magnet cover plate 56 is provided for each magnet pair. An outer cover plate 58 is provided for each permanent magnet array. Cover plate 56, like back plate 48 is made of a ferromagnetic metallic material whereas cover plate 58 is made of a non-ferromagnetic material.

Particularly note, however, that the along the length of the magnet retainer plate the magnet pairs are alternately reversed in polarity with respect to each other. Thus, the sub-assembly permanent magnets are so arrayed as to give the resulting combined magnetic fields in each target sub-assembly a unique shape. The control box sensor sub-assembly arrays of Hall-effect devices functions to look at and recognize the unique shapes and strengths of the combined magnetic fields. The vertical and horizontal position of the Hall-effect devices, may change relative to the target magnet pairs because of rail movement due to thermal and loading changes without affecting the output of the controller sub-assembly 18. This is because movement in these directions does not change the distance of the switch point from the track rail.

Figure 4:
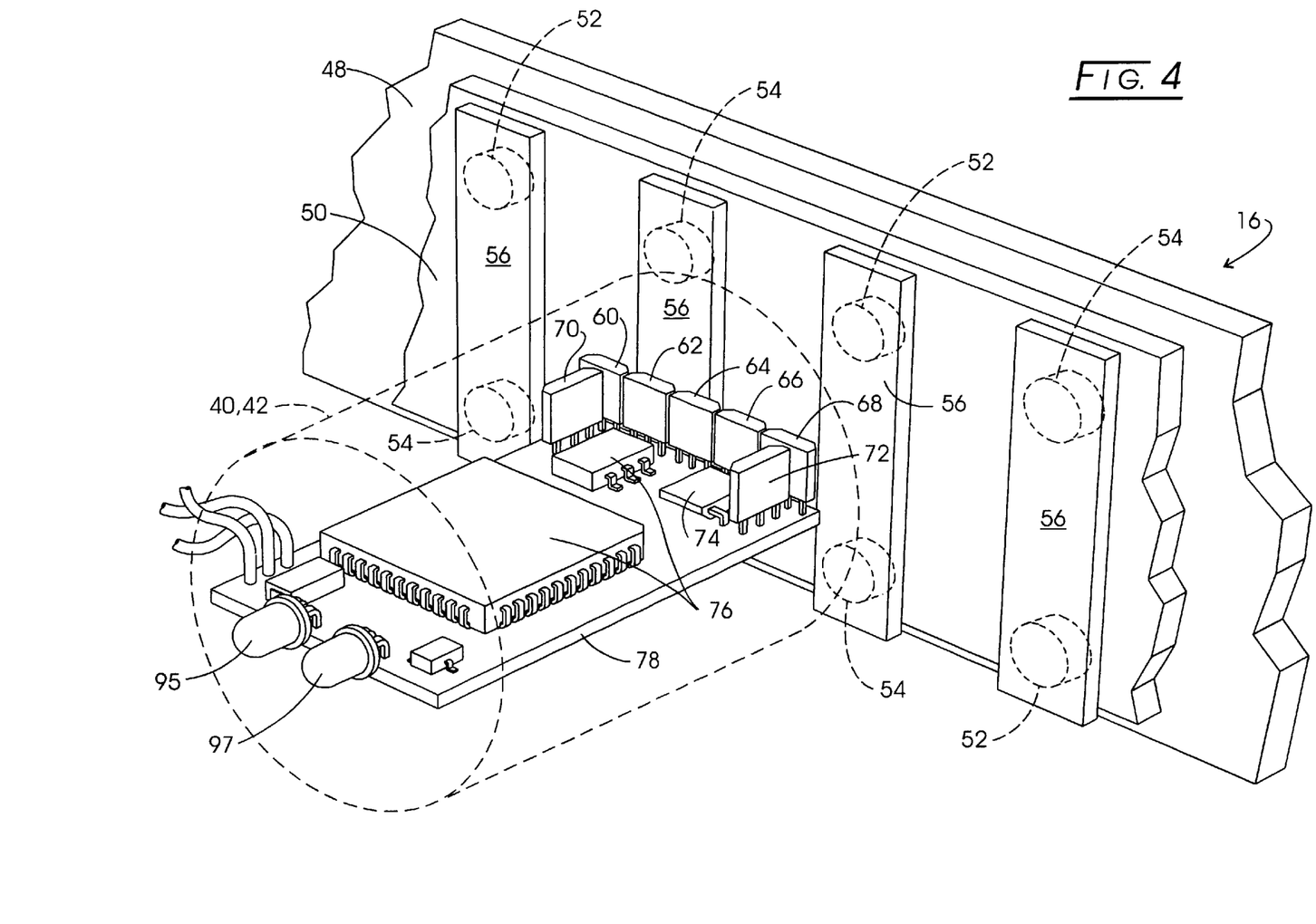
FIG. 4 is schematic view of the "engaged" positioning of an invention sensor array element relative to an invention target magnetic field source array element.

FIG. 4 provides construction details of one of the paired apparatus sensor sub-assemblies (40 or 42) that are incorporated into control box sub-assembly 18. Each such sub-assembly is basically comprised of a group of five forward-facing conventional analog Hall-effect semiconductor devices (sensors) 60, 62, 64, 66, and 68, two transverse- or side-facing Hall-effect sensors 70 and 72 one each at end or side of sensor group 60–68, one vertical-facing Hall-effect semiconductor device 74, and a portion of electric/electronic circuitry 76, all mounted on a dielectric mounting board 78. Each set of such components is housed within a non-ferromagnetic metal cannister (not numbered, but see FIG. 2) that is reciprocally positioned within a threaded stainless steel sleeve 32 and held in position by a co-operating and selectively operable cannister holder-clamp 88 (shown in FIG. 8) that is contained within the housing component of controller sub-assembly 18. It should be noted that the spacing between the outer forward facing Hall-effect devices 60 and 68 and the transverse facing Hall-effect devices 70 and 72 should correspond substantially with the spacing between the magnetic fields generated by the target magnet pairs 52 and 54.

Figure 5:
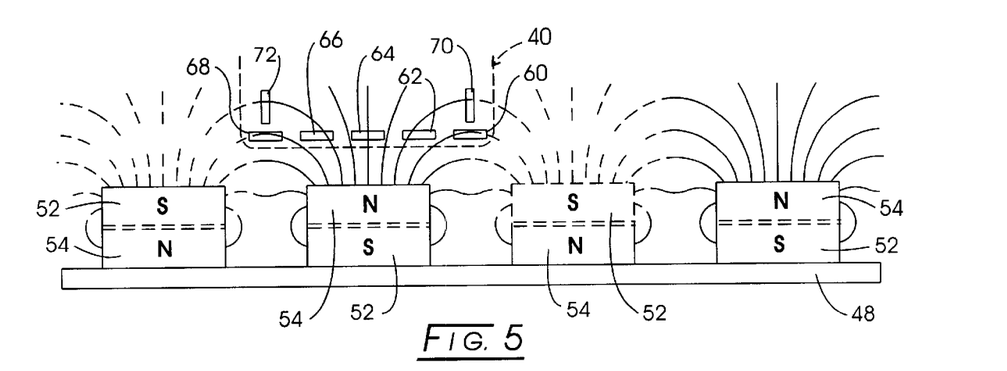
FIGS. 5, 6, and 7 schematically illustrate various registration and non-registration conditions of an invention sensor array element relative to an invention target magnetic field source array element.
Figure 6:
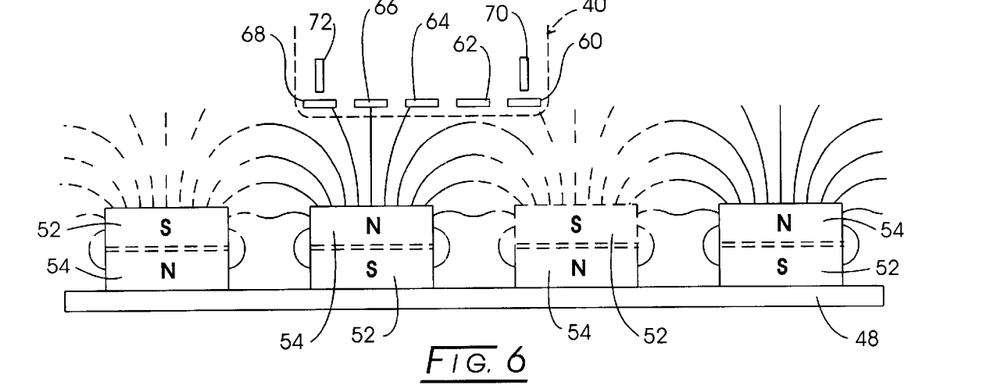
Figure 7:
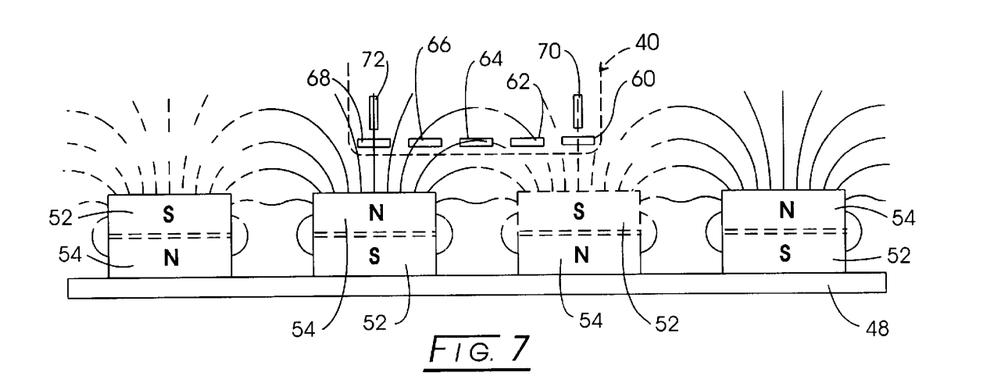

The function of each target (44 or 46) is to provide a set of four spaced-apart and particularly-oriented magnetic sub-fields. As indicated in FIGS. 5, 6, and 7, adjacent individual magnetic sub-fields have opposite polarities. The number of magnetic sub-fields required in a sensor sub-assembly to comprise the total magnetic field is basically dependent on the distance between the extreme outer two (right end and left end) forward-facing Hall-effect devices 60 and 68.

Vertical-facing sensor 74 has no role in determining the proper alignment and spacing of switch point 14 relative to stock rail 12. However, it is useful in a sensor sub-assembly to provide assurance that none of permanent magnets 52, 54 has a vertical component of its flux field that exceeds a prescribed value for the vertical flux component of the entire permanent magnet array.

The controller sub-assembly 18 functions: (1) to recognize the target attached to the switch point and not some piece of ferromagnetic material which may have become lodged between the switch assembly switch point and stock rail components, and (2) to determine whether the switch point is within a prescribed distance from the stock rail when the switch assembly is in a "closed" condition.

In some railroad operation applications such prescribed distance is one-fourth inch, plus or minus one thirty-second inch. If the assembly switch point and stock rail components are positioned relative to each other within the prescribed distance, the switch assembly is considered to be satisfactorily closed and the invention apparatus generates a "true" control signal; if the separation of stock rail and switch point is not within the prescribed distance the switch assembly is considered to be unsatisfactorily closed and a "false" control signal is generated. Such "false" signal invokes a warning or operating restriction signal (usually a particularly-colored light) visible to railroad operating personnel positioned a distant from the switch assembly.

In the invention apparatus, target recognition occurs when the sensors pairs 60, 70 and 68,72 see magnetic fields generated by their aligned target sub-assembly 44 or 46 having flux densities and flux magnitudes on opposite sides of controller sub-assembly 18 that are within specified or pre-determined set deviations. Target distance determination occurs when the programmed electric/electronic circuitry 76 (FIG. 10) polls Hall-effect devices 60 through 68 for maximum magnetic flux density and at least one of such sensors has a flux density value or magnitude that equals or exceeds a specified or pre-determined minimum flux density value or magnitude thereby indicating satisfactory switch closure i.e. switch point 14 is within a specified distance from track rail 12. (See FIG. 11A). Such target distance confirmation may be accomplished as a first step to having sensors 40 and 42 output "true" signals. However, the order of steps leading to the outputs of sensors 40 and 42 is not critical. Additionally, to receive a "true" signal from the outputs of sensors 40 and 42, outer end forward-facing Hall-effect devices 60 and 68 must receive and indicate combined flux density magnitudes equal to or less than a set deviation. If the flux directions at the outer end Hall-effect devices 60 and 68 are the same, the sum of the combined flux density magnitudes must be equal to or less than a specified or set maximum allowable deviation, whereas if the flux directions at the outer end Hall-effect devices 60 and 68 are opposite, the difference between the flux density magnitudes of devices 60 and 68 must equal to or less than a specified or set maximum allowable deviation. (See FIG. 11B). Although, the second step to having a "true" signal/output from devices 40 and 42 requires detection of magnitude and direction of flux densities by two laterally spaced forward-facing Hall-effect sensors 60 through 68 and the preferred embodiment describes the detection as being accomplished by extreme outer-end devices 60 and 68, the term "outer-end devices" is intended to mean two laterally spaced devices near the opposite ends of the array. The two laterally spaced devices need not be at the extreme outer ends of the array 60 through 68. Also, to receive a "true" signal, right and left side-facing Hall-effect sensor 70 and 72 must receive and indicate combined flux density magnitudes within a specified or set deviation. If the flux directions at the right and left side-facing sensors 70 and 72 are the same, the sum of the combined flux density magnitudes of the devices must equal to or less than a specified or set maximum allowable deviation whereas if the flux directions at the right and left side-facing sensors 70 and 72 are opposite, the difference between the flux density magnitudes of the devices 70 and 72 must be equal to less than a specified or set maximum allowable deviation. (See FIG. 11C).

FIG. 5 schematically illustrates a satisfactorily closed switch assembly (i.e., target-to-sensor registering condition) where the polled forward-facing sensors 6048 identify through sensor 64 a flux density above the pre-programed minimum flux density for satisfactory target distance confirmation or switch closure i.e. switch point 14 is within a specified distance from track rail 12, and outer sensor pair 60, 68 recognizes magnetic fields of the same neutral (not opposite) polarization whereas outer sensor pair 70 and 72 recognizes magnet field of opposite polarization and the combined flux magnitudes of both the extreme outer end forward forcing sensors 60 and 68 and the right and left side-facing sensors 70 and 72 are equal to or less than set maximum allowable deviation limits. FIG. 6 schematically illustrates a non-registering condition where all of polled forward-facing sensors 60 through 68 indicate a magnetic flux density below the pre-programmed minimum flux density for satisfactory switch assembly closure—a result of excessive stock rail-to-switch point separation and the sensor array 60 through 68 being positioned too far away from the magnetic fields with alternately reversed polarization generated by the target sub-assembly permanent magnets. In other words, proper target distance is not confirmed.

FIG. 7 schematically indicates a satisfactorily closed switch assembly (i.e., target-to-sensor properly aligned or in a "registered" condition) where the polled forward-facing sensors 60 through 68 detect and measure a flux density above the pre-programmed minimum flux density for proper target distance confirmation, i.e. satisfactory switch closure. The outer sensor pair 60, 68 recognizes magnetic fields of opposite polarization, the outer sensor pair 70 and 72 recognizes a very small perpendicular flux and the combined magnetic fields of both the outer end forward facing sensors 60 and 68 and the right and left side-facing sensors 70 and 72 are equal to or less than specified or set maximum allowable deviation limits.

Figure 8:
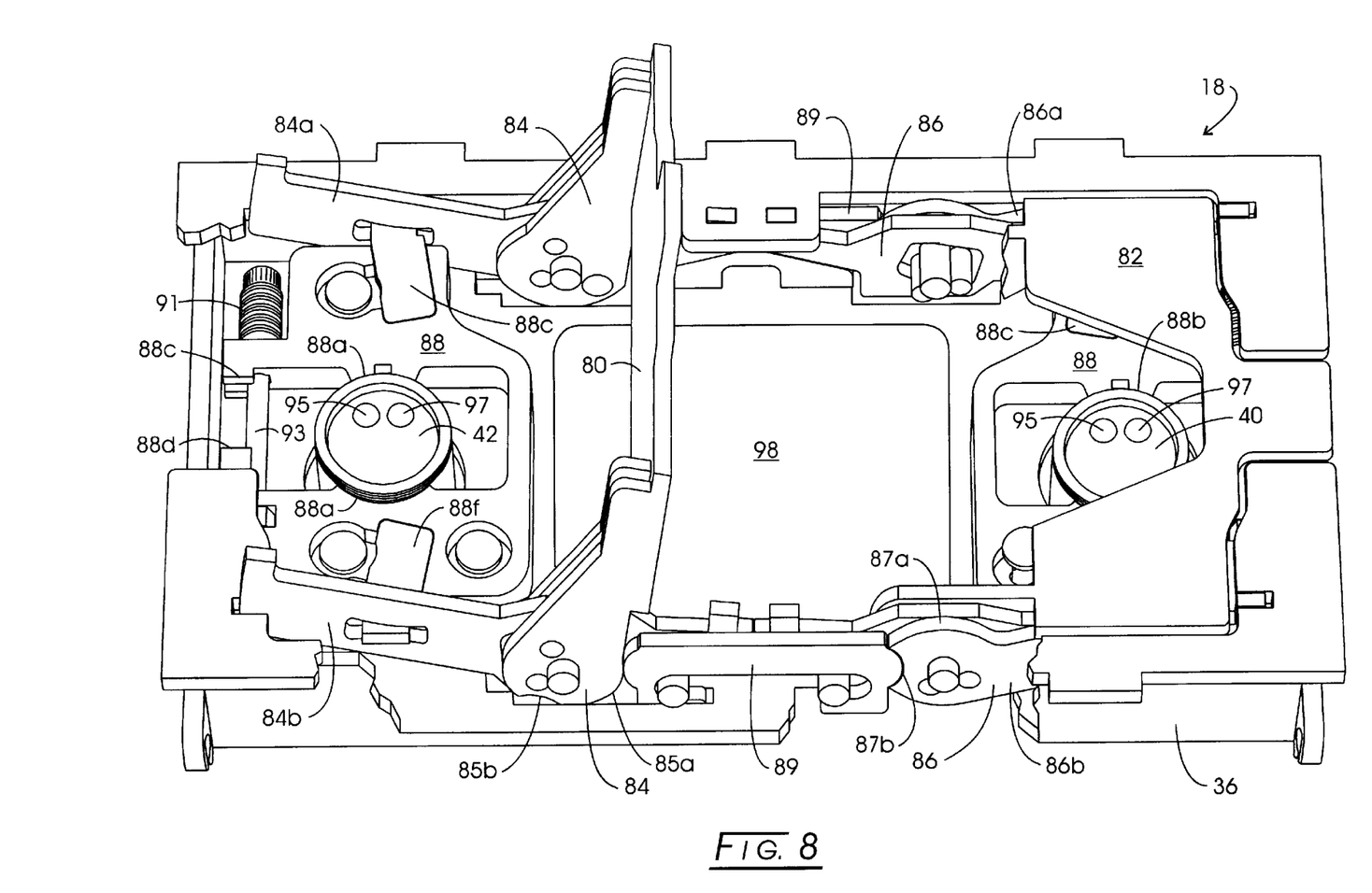
FIG. 8 is a front elevation view of the control box element of FIGS. 1 and 2 with the control box cover plate removed.

FIG. 8 is a front elevation view of the control box or controller element 18 of the present invention. Basically, the control box body 36 is provided with a pair of access doors 80 and 82 which are respectively pivotally connected to body 36 by articulated hinges 84 and 86, and also serves as a housing for microprocessor 98. Such microprocessor basically is a microchip which receives a digital output from the Hall-effect sensors and is a component of the invention electric/electronic circuitry element 76. See FIG. 10. The linkages of articulated hinges 84 and 86 are so-designed that only one of access doors 80 and 82 can be opened at any time; each such door functions as an interlock for the other door. Each hinge 84 and 86 has a cam actuating surface 85a and 87a and a concave cam receiving surface 85b and 87b formed therein. When one door 80 or 82 and its respective hinge 84 or 86 open, cam actuating surface 85a and 87a on the hinge moves a slidable cam lock member 89 into the cam receiving surface 85b or 87b of the opposite hinge 84 or 86 to prevent movement of the other door 80 or 82. FIG. 8 illustrates access door 80 in an opened condition and access door 82 is in a closed condition.

Also included within the body 36 of control box element 18 are two selectively-releasable holder-clamps 88 that each co-operates with one of sensor sub-assemblies 40 or 42. Each holder-clamp 88 is a one piece unit having clamp surfaces 88a and 88b that engage the outer surface of and rigidly holds its respective sensor sub-assembly 40 and 42 in place until it has been released to permit adjustment of the position of the sensor sub-assembly relative to target sub-assembly 16. Preferably sensor sub-assemblies 40 and 42 are retained within clamp surfaces 88a and 88b by an interference fit. Each holder-clamp 88 has an open end defined by end surfaces 88c and 88d. Biasing ends 88c and 88d apart allows a sensor assembly 40 or 42 to be moved along its longitudinal axis for adjustment with respect to target assembly 16. Ends 88c and 88d are biased together by a compression spring 91 mounted on a shaft 93. Also, each holder-clamp 88 is connected to a respective access door 80 and 82 to be moved in directions parallel to the longitudinal axis of its sensor sub-assembly (perpendicular to the surface of the stock rail web) by the opening and closing movement of its respective co-operating access door and hinge. Each holder-clamp 88 has a pair of arms 88e and 88f which are received in openings formed in pairs of hinge arms 84a, 84b and 86a and 86b.

The amount of such holder-clamp movement and sensor sub-assembly 40 and 42 movement corresponds to the maximum permissible distance of separation (e.g., one-fourth inch plus or minus one-thirty second inch) between stock rail 12 and switch point 14 in the generation of an apparatus "true" control signal signifying that satisfactory switch closure has been obtained. Opening movement of the access door lifts or retracts the holder-clamp 88 away from the stock rail web; closing movement of the access door following calibration positioning of the sensor sub-assembly within the holder-clamp advances the holder-clamp toward the stock rail web a distance corresponding to the maximum permissible distance of stock rail—switch point separation.

During adjustment of the sensor sub-assembly 40 or 42 relative to its target sub-assembly 16, the switch point 14 must contact the stock rail 12. When adjusting the position of a sensor sub-assembly 40 or 42 relative to its respective released clamp 88 and to target sub-assembly 16, it is necessary to move the sensor sub-assembly 40 or 42 within its respective released clamp 88 only until the proper sensor output values are obtained indicating the switch point is abutting the stock rail. Such condition is indicated by two light emitting diodes 95 and 97 mounted on board 78. Diodes 95 and 97 preferably are different colors with one diode indicating switch point 14 is closed with respect to stock rail 12 (a "true" condition) and the other diode indicating switch point 14 is open with respect to stock rail 12 (a "false" condition). When that position has been realized the clamp 88 is selectively activated to rigidly hold its sensor sub-assembly. As mentioned above, when the connected access door is subsequently closed, the clamp 88 and its held sensor sub-assembly 40 or 42 are moved toward the target sub-assembly 16 the afore-described maximum permissible separation distance. Hence, when the switch point is separated by a distance of from zero to the maximum permissible, from the stock rail, the sensor sub-assembly 40 or 42 will generate its proper sensor output value.

Figure 9:
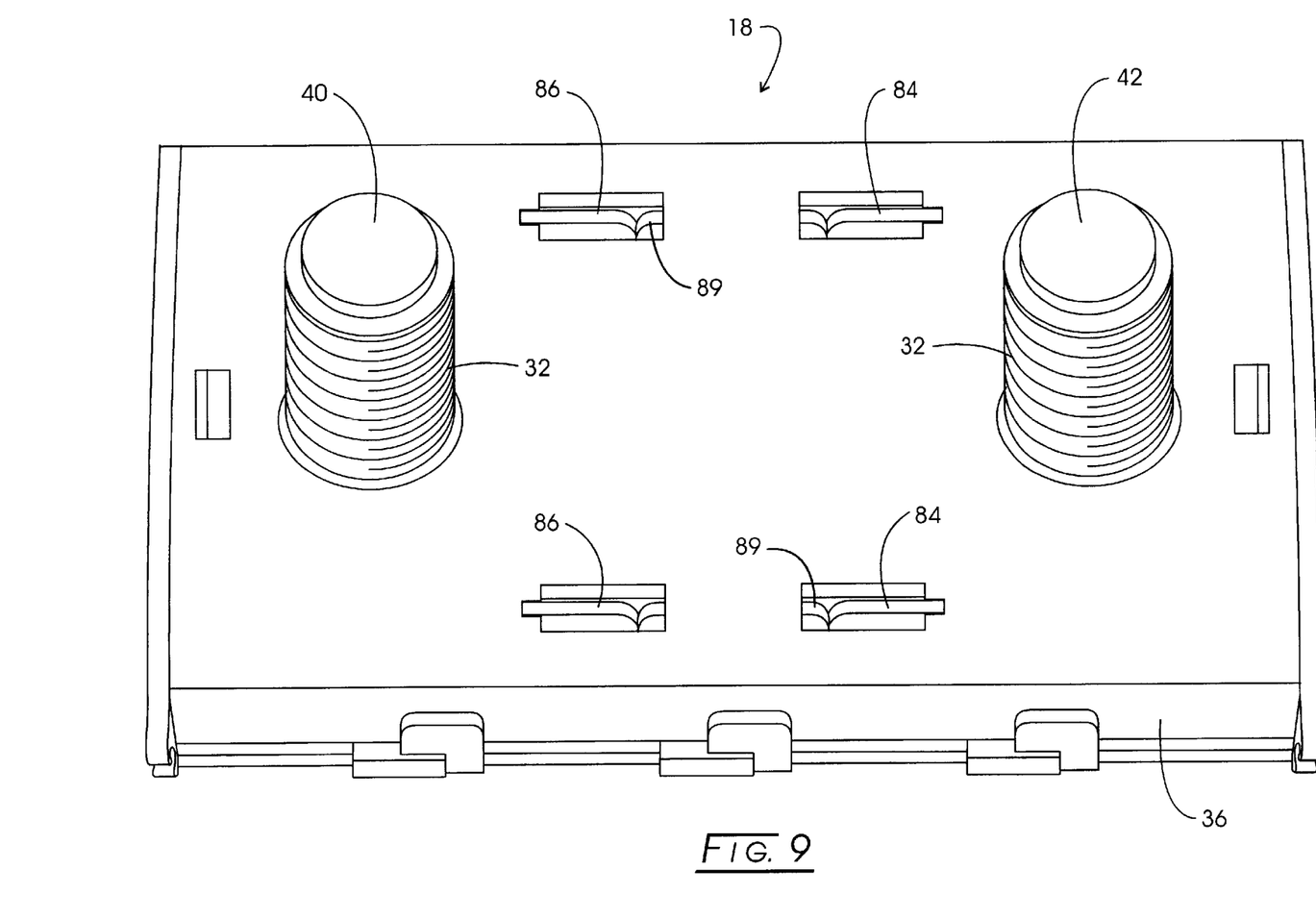
FIG. 9 is a rear elevation view of the control box element of the present invention illustrating the positioning of the invention dual sensor array elements.

FIG. 9 is provided to illustrate the rear of control box (controller) in elevation and to show the positioning and protrusion of the system's threaded sleeves 32 and the two sensor sub-assemblies 40 and 42.

Figure 10:
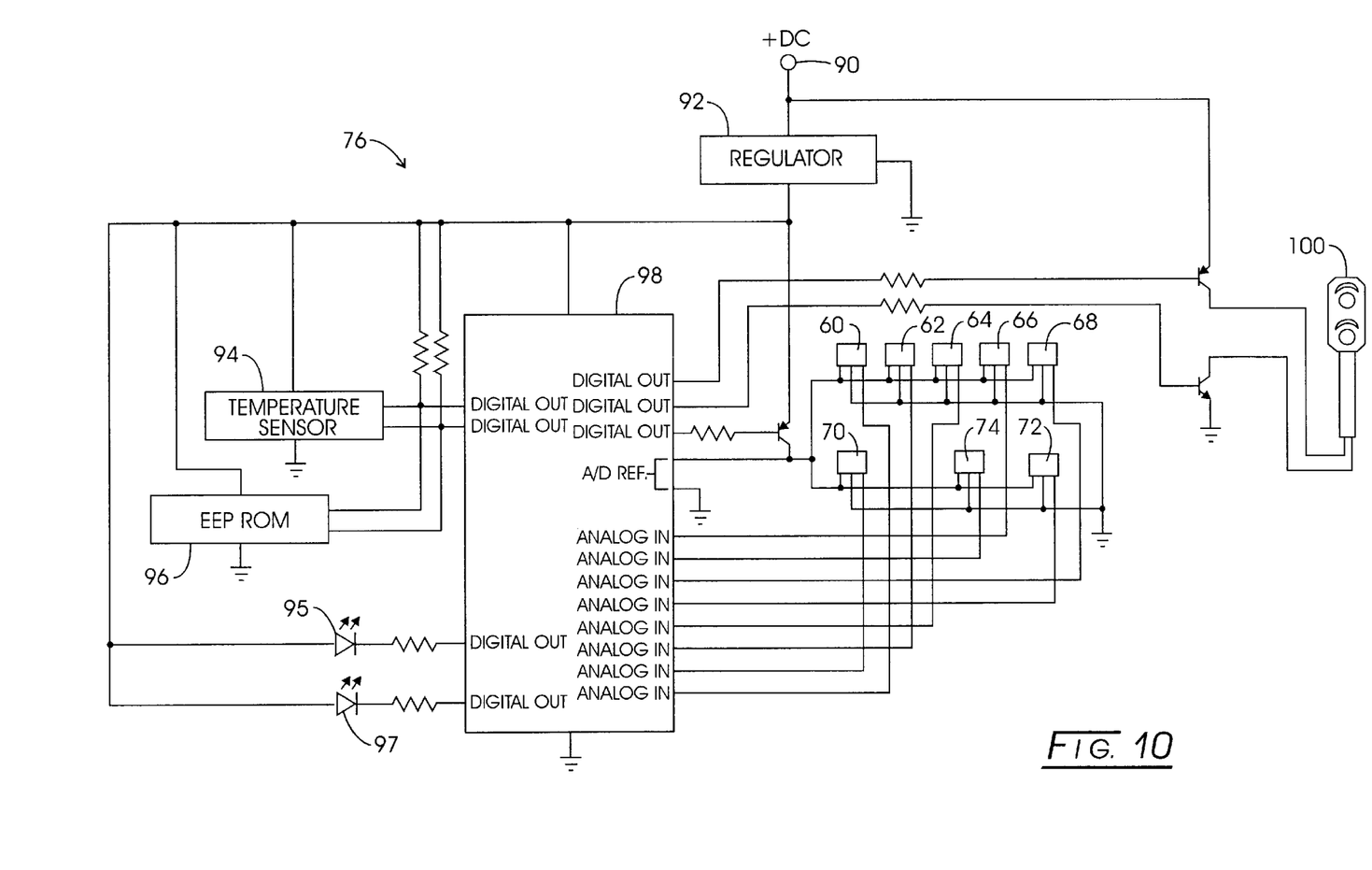
FIG. 10 is a schematic functional block diagram of the invention control box element and signal display, in totality.

In FIG. 10 is a schematic functional block diagram of the invention control box or controller electric/electronic circuitry element and including a conventional railroad operating visual signal display 100. Such essentially corresponds to the switch assembly electric/electronic circuitry element identified by the reference numeral 76. The circuitry includes a direct current source 90, preferably in the range of 10 to 28 volts, a voltage regulator 92, a temperature sensor 94, a read-only-memory 96 which is of the electronically erasable and programable type, the microprocessor 98, and the conventional visual or visible railroad operating signal display 100. The outputs of the electric/electronic circuitry for the two sensor sub-assemblies 40 and 42 are combined prior to entering signal device 100. The outputs of both sensor sub-assemblies 40 and 42 must indicate a "true" condition in order for signal device 100 to indicate proper switch point closure with one exception. If one of the access doors 80 and 82 is open to allow adjustment of one of the sensor sub-assemblies 40 and 42, the circuitry will indicate a switch point closed condition to signal device 100 if the output at the sensor sub-assembly behind the closed access door 80 and 82 has a "true" condition output. FIG. 10 also illustrates the manner in which Hall-effect sensors 60 through 74 are integrated into the apparatus.

Figure 11A:
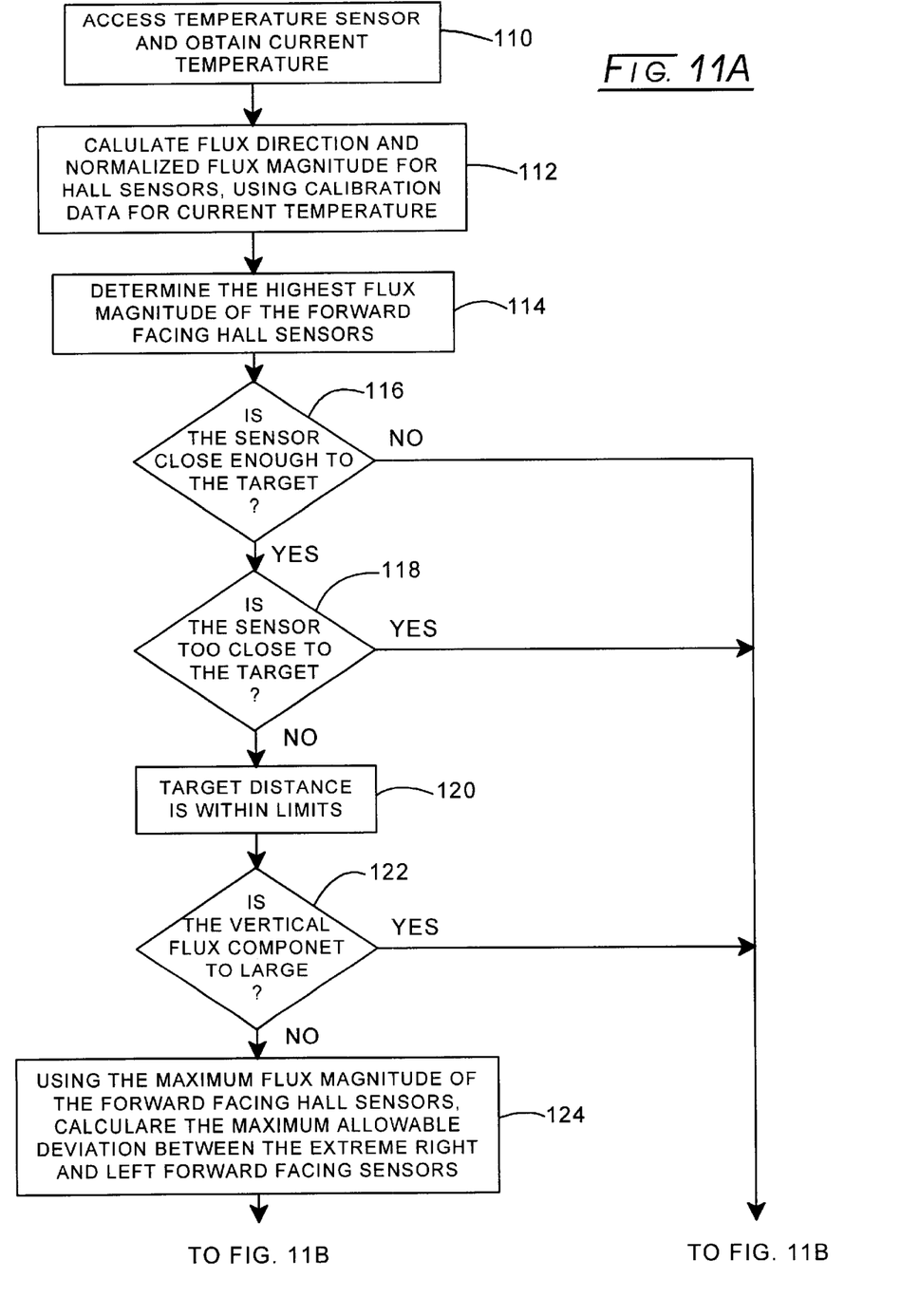
FIGS. 11A, 11B, and 11C comprise a schematic flow diagram of the program for the microprocessor portion of the invention electrical/electronic circuitry element.
Figure 11B:
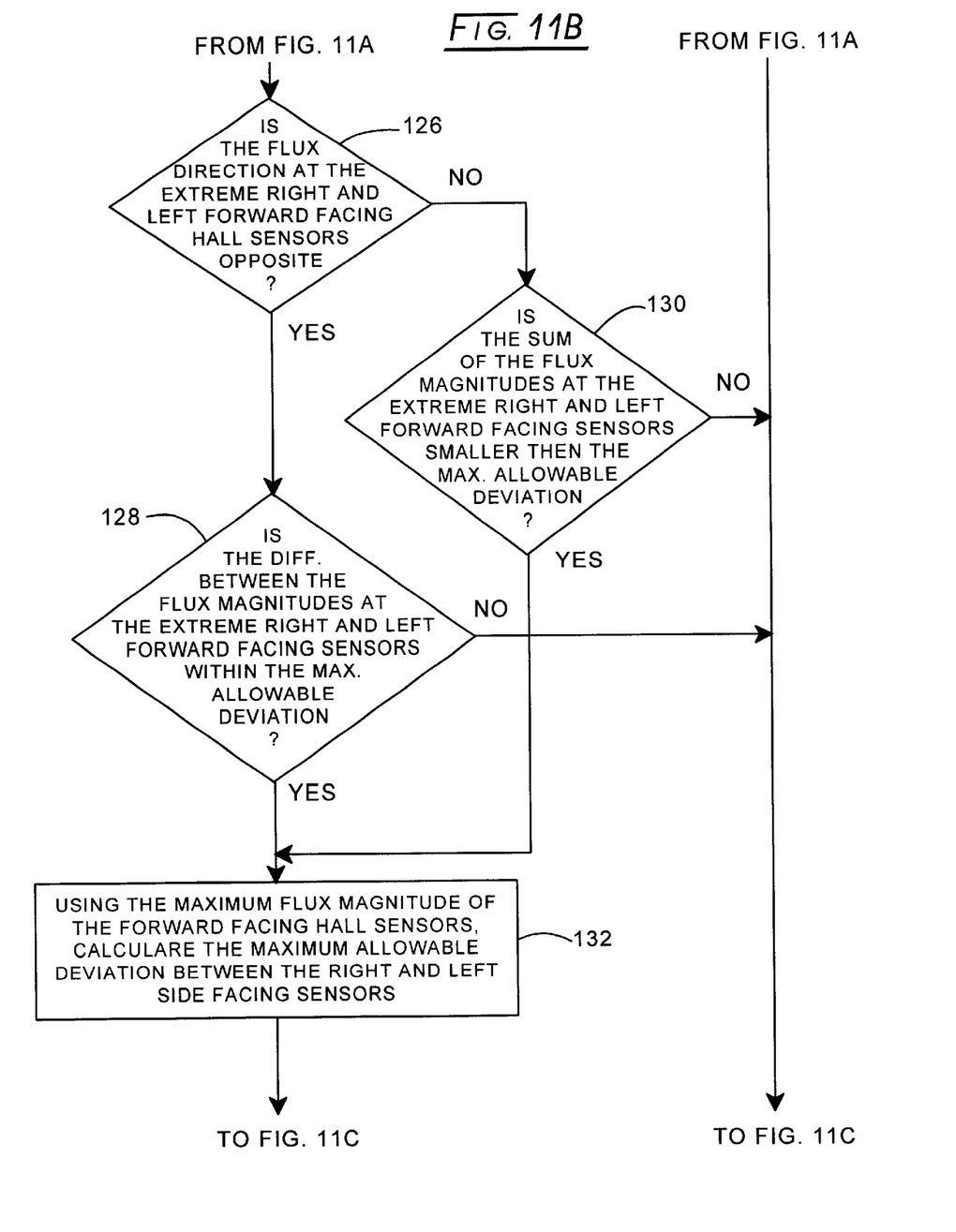
Figure 11C:
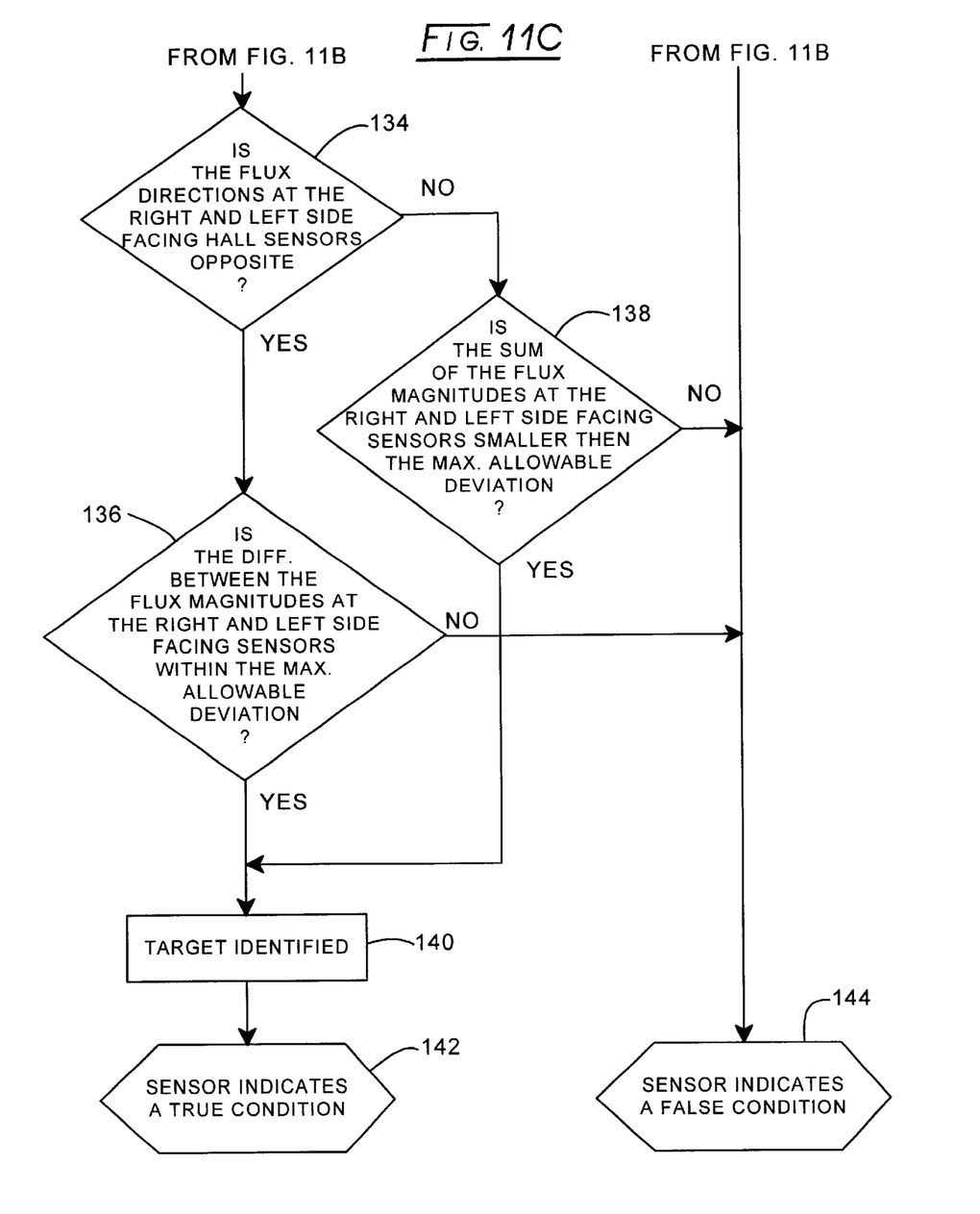

FIGS. 11A, 11B, and 11C comprise a schematic flow diagram of the step-by-step decision-making process or logic sequence that is executed by controller sub-assembly 18 and that is programmed into the microprocessor 98 portion of the invention electrical/electronic circuitry element.

Referring to FIG. 11A, block 110 discloses the step of accessing the temperature sensor and obtaining the current temperature. Block 112 comprises the step of calculating flux direction and normalized flux magnitude for Hall sensors, using calibration data for current temperature. The calculations of blocks 110 and 112 are standard initialization proceedings for calibrating Hall sensors.

Subsequent to switch point 14 being closed against track rail 12, the unit determines the highest flux magnitude of one of the forward facing Hall sensors 60 through 68 as indicated by block 114. The calculation of block 114 is output to block 116. Block 116 determines if the maximum flux density detected by any one of Hall-effect devices 60 through 68 equals or exceeds a predetermined minimum flux density value which indicates that the sensor is close enough to the target to indicate the switch point 14 is properly closed against the track rail 12. If the answer is no, the signal proceeds to block 144 indicating a false condition. If the answer is yes, the signal is output to block 118 which determines whether the sensor is too close to the target. This calculation is accomplished by comparing the highest flux density magnitude of forward facing Hall sensors 60 through 68 with a maximum flux value to determine if the sensor is too close to the target. If the answer at block 118 is in the affirmative, the signal is output to block 144 indicating a false condition. If the answer is no, the signal proceeds to block 120 which indicates the target is within the set distant limits. Thereafter, the signal proceeds to block 122 which calculates whether the vertical flux component is too large. This is accomplished by comparing the vertical flux density magnitude at the vertical facing Hall sensor 74 with a maximum vertical flux value. The purpose of this inquiry is to ensure that a foreign element having a very large flux density is not providing a false reading to the trackwork sensors.

If the answer to block 122 is in the affirmative, the signal goes to block 144 which indicates a false condition. If the answer is in the negative, it is output to block 124 which uses the maximum flux magnitude of the forward facing Hall sensors 60 through 68 to calculate the maximum allowable deviation between the extreme right and left forward facing sensors 60, 68. The signal at block 124 proceeds to block 126 which determines whether the flux direction at the extreme right and left forward facing Hall sensors 60 and 68 is of the same or opposite polarity. If the polarity is the same, the signal proceeds to block 130 which determines whether the sum of the flux magnitudes at the extreme right and left side facing sensors 60 and 68 is equal to or smaller than the value of a set or specified maximum allowable deviation. If it is not equal to or smaller, the signal proceeds to block 144 indicating a false condition. If it is equal to or smaller than the maximum allowable deviation, the signal is directed to the input of block 132. Referring again to block 126, if the polarity is opposite, the signal is output to block 128 which compares the difference in flux magnitudes at the extreme right and left forward facing sensors 60 and 68 with a set or specified maximum allowable deviation. If the difference in flux magnitudes is within (equal to or less than) the maximum allowable deviation that signal also proceeds to block 132. If it is not, the signal proceeds to block 144 which indicates a false condition.

At block 132, the maximum flux magnitude of the forward facing Hall sensors is used to calculate the maximum allowable deviation between the right and left side facing sensors 70 and 72. Thereafter the signal is applied to the input of block 134 which functions to determine whether the flux directions at the right and left side facing Hall sensors 70 and 72 are opposite or the same. If they are the same, the signal is output to block 138 where the sum of the flux magnitudes at the right and left side facing sensors 70 and 72 is compared to ensure that it is equal to or smaller than a specified or set maximum allowable deviation. If it is not, the signal is transferred to block 144 indicating a false condition. If it is the signal is transferred to the input of target identified block 140. Referring again to block 134, where the flux directions at the right and left side facing Hall sensors 70 and 72 are opposite, the signal is transferred to the input of block 136. This block calculates the difference between the flux magnitudes at the right and left side facing Hall sensors 70 and 72 to determine if it is equal to or less than a set maximum allowable deviation. If the magnitude is not equal to less than the set allowable deviation the signal is output to block 144 which indicates a false condition. If the magnitude is within the set deviation, the signal is input to target identified block 140. The output of block 140 is applied to a sensor block 142 which indicates a true condition. This block indicates that switch point 14 is properly positioned with track rail 12. As mentioned above, preferably the outputs of both sensor sub-assemblies 40 and 42 must indicate a sensor "true" condition before signal device 100 indicates proper switch point closure. The exception to this is where one of the sensor access doors 80 and 82 is open.

The output of sensor block 142 for sensors 40 and 42 illuminates a visual sensor which may be a green light at signal indicating device 100. Similarly, the output of sensor block 144, illuminates a visual sensor at signal indicating device 100 which may be a red light at indicator 100.

The aforementioned flow sheet may be utilized by one skilled in the art to properly program microprocessor element 98 of controller element 18.

As noted above, the digital outputs of semi-conductor device 98 also are applied to LEDs 95 and 97 which function to provide an indication as to whether the switch point is properly positioned with respect to the track rail. This condition also is indicated when the cover doors 80 and 82 are open in order to adjust sensor sub-assemblies 40 and 42 as described above.

Various changes may be made to the size, shape, and materials of construction set forth in the specification drawings and detailed description without departing from the scope, meaning, or intent of the claims which follow.

I claim my invention as follows:

1. A railroad trackwork switch assembly comprising:
   a stock rail that in a relatively fixed position;
   a switch point that is relatively movable into and out of closed switch engagement with said stock rail;
   a target sub-assembly having an array of permanent magnets carried by said switch point and generating a total magnetic flux field of unique shape and density; and
   a controller sub-assembly which is secured to said stock rail, which generates railroad operating control signals when said switch point is sufficiently engaged in closure with said stock rail and when said switch point rail is insufficiently engaged in closure with said stock rail, which has a sensor array of Hall-effect devices aligned opposite said target array of permanent magnets, and which has control signal electric/electronic circuitry controlled by said Hall-effect devices,
   said control signal electric/electronic circuitry generating a "true" control signal when said Hall-effect devices sense the unique shape and strength of the total magnetic flux field of said target permanent magnets when said switch point is sufficiently engaged in closure with said stock rail and generating a "false" control signal when not sensing the unique shape and strength of the total magnetic flux field of said target array of permanent magnets because said switch point is not sufficiently engaged in closure with said stock rail.

2. The railroad trackwork switch assembly invention defined by claim 1, and wherein said target sub-assembly array of permanent magnets generates a total magnetic flux field comprised of multiple adjacent magnetic flux sub-fields, adjacent pairs of said multiple adjacent magnetic flux sub-fields having opposite magnetic polarities.

3. The railroad trackwork switch assembly defined by claim 2, and wherein said controller sub-assembly sensor array of Hall-effect devices is comprised of a row of multiple forward-looking devices with one of said forward-looking devices at the right end of said row and one of said forward-looking devices at the left end of said row, and a pair of spaced-apart transverse-looking devices, each said Hall-effect device detecting and indicating the magnetic flux density and polarity of the closest magnetic flux sub-field.

4. The railroad trackwork assembly defined by claim 3, and wherein said sensor controller sub-assembly control signal electric/electronic circuitry generates a "true" control signal only if at least one of said forward-looking Hall-effect devices detects and indicates a magnetic flux sub-field density equal to or above a prescribed magnetic flux sub-field density indicative that the switch point is within a specified distance to the stock rail.

5. The railroad trackwork assembly defined by claim 3 and wherein said sensor controller sub-assembly control signal electric/electronic circuitry generates a "true" control signal only where each of said right end and left end forward-looking Hall-effect devices detect and indicate a magnetic flux sub-field density and said right and left detected and indicated magnetic-flux sub-field densities are of opposite polarity and have a difference in flux sub-field density equal to or less than a maximum allowable deviation.

6. The railroad trackwork assembly defined by claim 3, and wherein said sensor controller sub-assembly control signal electric/electronic circuitry generates a "true" control signal only where each of said right end and left end forward-looking Hall-effect devices detect and indicate a magnetic flux sub-field density and said right and left detected and indicated magnetic flux sub-field densities have the same polarity and the sum of said magnetic flux sub-field densities is equal to or less than a maximum allowable deviation.

7. The railroad trackwork assembly defined by claim 4 and wherein said sensor controller sub-assembly control signal electric/electronic circuitry generates a "true" control signal only where each of said right end and left end forward-looking Hall-effect devices detect and indicate a magnetic flux sub-field density and said right and left detected and indicated magnetic-flux sub-field densities are of opposite polarity and have a difference in flux sub-field density equal to or less than a maximum allowable deviation.

8. The railroad trackwork assembly defined by claim 4, and wherein said sensor controller sub-assembly control signal electric/electronic circuitry generates a "true" signal only where each of said right end and left end forward-looking Hall-effect devices detect and indicate a magnetic flux sub-field density and said right and left detected and indicated magnetic flux sub-field densities have the same polarity and the sum of said magnetic flux sub-field densities is equal to or less than a maximum allowable deviation.

9. The railroad trackwork assembly defined by claim 3, and wherein said sensor controller sub-assembly control signal electric/electronic circuitry generates a "true" signal only where said transverse-looking Hall-effect devices detect and indicate first and second magnetic flux sub-field densities and said first and second detected and indicated magnetic flux sub-field densities are of opposite polarity and have a difference in flux sub-field densities equal to or less than a maximum allowable deviation.

10. The railroad trackwork assembly defined by claim 4, and wherein said sensor controller sub-assembly control signal electric/electronic circuitry generates a "true" signal only where said transverse-looking Hall-effect devices detect and indicate first and second magnetic flux sub-field densities and said first and second detected and indicated magnetic flux sub-field densities are of opposite polarity and have a difference in flux sub-field densities equal to or less than a maximum allowable deviation.

11. The railroad trackwork assembly defined by claim 5, and wherein said sensor controller sub-assembly control signal electric/electronic circuitry generates a "true" signal only where said transverse-looking Hall-effect devices detect and indicate first and second magnetic flux sub-field densities and said first and second detected and indicated magnetic flux sub-field densities are of opposite polarity and have a difference in flux sub-field densities equal to or less than a maximum allowable deviation.

12. The railroad trackwork assembly defined by claim 6, and wherein said sensor controller sub-assembly control signal electric/electronic circuitry generates a "true" signal only where said transverse-looking Hall-effect devices detect and indicate first and second magnetic flux sub-field densities and said first and second detected and indicated magnetic flux sub-field densities are of opposite polarity and have a difference in flux sub-field densities equal to or less than a maximum allowable deviation.

13. The railroad trackwork assembly defined by claim 7, and wherein said sensor controller sub-assembly control signal electric/electronic circuitry generates a "true" signal only where said transverse-looking Hall-effect devices detect and indicate first and second magnetic flux sub-field densities and said first and second detected and indicated magnetic flux sub-field densities are of opposite polarity and have a difference in flux sub-field densities equal to or less than a maximum allowable deviation.

14. The railroad trackwork assembly defined by claim 8, and wherein said sensor controller sub-assembly control signal electric/electronic circuitry generates a "true" signal only where said transverse-looking Hall-effect devices detect and indicate first and second magnetic flux sub-field densities and said first and second detected and indicated magnetic flux sub-field densities are of opposite polarity and have a difference in flux sub-field densities equal to or less than a maximum allowable deviation.

15. The railroad trackwork assembly defined by claim 3 and wherein said sensor controller sub-assembly control signal electric/electrical circuitry generates a "true" signal only where said transverse-looking Hall-effect devices detect and indicate first and second magnetic flux sub-field densities and said first and second detected and indicated magnetic flux sub-field densities have the same polarity and the sum of said first and second magnetic flux sub-field densities is equal to or less than a maximum allowable deviation.

16. The railroad trackwork assembly defined by claim 4 and wherein said sensor controller sub-assembly control signal electric/electrical circuitry generates a "true" signal only where said transverse-looking Hall-effect devices detect and indicate first and second magnetic flux sub-field densities and said first and second detected and indicated magnetic flux sub-field densities have the same polarity and the sum of said first and second magnetic flux sub-field densities is equal to or less than a maximum allowable deviation.

17. The railroad trackwork assembly defined by claim 5 and wherein said sensor controller sub-assembly control signal electric/electrical circuitry generates a "true" signal only where said transverse-looking Hall-effect devices detect and indicate first and second magnetic flux sub-field densities and said first and second detected and indicated magnetic flux sub-field densities have the same polarity and the sum of said first and second magnetic flux sub-field densities is equal to or less than a maximum allowable deviation.

18. The railroad trackwork assembly defined by claim 6 and wherein said sensor controller sub-assembly control signal electric/electrical circuitry generates a "true" signal only where said transverse-looking Hall-effect devices detect and indicate first and second magnetic flux sub-field densities and said first and second detected and indicated magnetic flux sub-field densities have the same polarity and the sum of said first and second magnetic flux sub-field densities is equal to or less than a maximum allowable deviation.

19. The railroad trackwork assembly defined by claim 7 and wherein said sensor controller sub-assembly control signal electric/electrical circuitry generates a "true" signal only where said transverse-looking Hall-effect devices detect and indicate first and second magnetic flux sub-field densities and said first and second detected and indicated magnetic flux sub-field densities have the same polarity and the sum of said first and second magnetic flux sub-field densities is equal to or less than a maximum allowable deviation.

20. The railroad trackwork assembly defined by claim 8 and wherein said sensor controller sub-assembly control signal electric/electrical circuitry generates a "true" signal only where said transverse-looking Hall-effect devices detect and indicate first and second magnetic flux sub-field densities and said first and second detected and indicted magnetic flux sub-field densities have the same polarity and the sum of said first and second magnetic flux sub-field densities is equal to or less than a maximum allowable deviation.

21. The railroad trackwork assembly defined by claim 3, and wherein said sensor controller sub-assembly control signal electric/electronic circuitry generates a "false" control signal when all of said forward-looking Hall-effect devices detects and indicates a magnetic flux sub-field density below a magnetic flux sub-field density indicative that the switch point is equal to or less than a specified distance to the stock rail.

22. A control signal generating assembly comprising:
   a target sub-assembly having an array of permanent magnets for mounting on a railroad trackwork switch assembly switch point and generating a total magnetic flux field of unique shape and density; and
   a controller sub-assembly, for mounting on a railroad trackwork switch assembly stock rail, which generates railroad operating control signals, which has a sensor array of Hall-effect sensor devices aligned opposite said target array of permanent magnets, and which has control signal electric/electronic circuitry controlled by said Hall-effect devices,
said control signal electric/electronic circuitry generating a "true" control signal when said Hall-effect devices sense the unique shape and strength of the total magnetic flux field of said target array permanent magnets and indicating said switch point is sufficiently engaged in closure with said stock rail and generating a "false control" signal when not sensing the unique shape and strength of the total magnetic flux field of said target array of permanent magnets.

23. The control signal generating assembly invention defined by claim 22, and wherein said target sub-assembly array of permanent magnets generates a total magnetic flux field comprised of multiple adjacent magnetic flux sub-fields, adjacent pairs of said multiple adjacent magnetic flux sub-fields having opposite magnetic polarities.

24. The control signal generating assembly invention defined by claim 22, and wherein said controller sub-assembly sensor array of Hall-effect devices is comprised of forward-looking devices and transverse-looking devices, each said Hall-effect device detecting and indicating the magnetic flux density and magnetic polarity of the closest magnetic flux sub-field.

25. The control signal generating assembly invention defined by claim 23, and wherein said controller sub-assembly sensor array of Hall-effect devices is comprised of a row of multiple forward-looking devices with one of said forward-looking devices at the right end of said row and one of said forward-looking devices at the left end of said row and a pair of spaced-apart transverse-looking devices, each said Hall-effect device detecting and indicating the magnetic flux density and polarity of the closest magnetic flux sub-field.

26. The control signal generating assembly invention defined by claim 25, and wherein said sensor controller sub-assembly control signal electric/electronic circuitry generates a "true" control signal only if at least one of said forward-looking Hall-effect devices detects and indicates a magnetic flux sub-field density equal to or above a pre-scribed magnetic flux sub-field density indicative that the switch point is within a specified distance to the stock rail.

27. The control signal generating assembly invention defined by claim 25, and wherein said sensor controller sub-assembly control signal electric/electronic circuitry generates a "true" control signal only where each of said right end and left end forward-looking Hall-effect devices detect and indicate a magnetic flux sub-field density and said right and left detected and indicated magnetic-flux sub-field densities are of opposite polarity and have a difference in flux sub-field density equal to or less than a maximum allowable deviation.

28. The control signal generating assembly invention defined by claim 25, and wherein said sensor controller sub-assembly control signal electric/electronic circuitry generates a "true" control signal only where each of said right end and left end forward-looking Hall-effect devices detect and indicate a magnetic flux sub-field density and said right and left detected and indicated magnetic flux sub-field densities have the same polarity and the sum of said magnetic flux sub-field densities is equal to or less than a maximum allowable deviation.

29. The control signal generating assembly invention defined by claim 26, and wherein said sensor controller sub-assembly control signal electric/electronic circuitry generates a "true" control signal only where each of said right end and left end forward-looking Hall-effect devices detect and indicate a magnetic flux sub-field density and said right and left detected and indicated magnetic-flux sub-field densities are of opposite polarity and have a difference in flux sub-field density equal to or less than a maximum allowable deviation.

30. The control signal generating assembly invention defined by claim 26, and wherein said sensor controller sub-assembly control signal electric/electronic circuitry generates a "true" signal only where each of said right end and left end forward-looking Hall-effect devices detect and indicate a magnetic flux sub-field density and said right and left detected and indicated magnetic flux sub-field densities have the same polarity and the sum of said magnetic flux sub-field densities is equal to or less than a maximum allowable deviation.

31. The control signal generating assembly invention defined by claim 25, and wherein said sensor controller sub-assembly control signal electric/electronic circuitry generates a "true" signal only where said transverse-looking Hall-effect devices detect and indicate first and second magnetic flux sub-field densities and said first and second detected and indicated magnetic flux sub-field densities are of opposite polarity and have a difference in flux sub-field densities equal to or less than a maximum allowable deviation.

32. The control signal generating assembly invention defined by claim 26, and wherein said sensor controller sub-assembly control signal electric/electronic circuitry generates a "true" signal only where said transverse-looking Hall-effect devices detect and indicate first and second magnetic flux sub-field densities and said first and second detected and indicated magnetic flux sub-field densities are of opposite polarity and have a difference in flux sub-field densities equal to or less than a maximum allowable deviation.

33. The control signal generating assembly invention defined by claim 27, and wherein said sensor controller sub-assembly control signal electric/electronic circuitry generates a "true" signal only where said transverse-looking Hall-effect devices detect and indicate first and second magnetic flux sub-field densities and said first and second detected and indicated magnetic flux sub-field densities are of opposite polarity and have a difference in flux sub-field densities equal to or less than a maximum allowable deviation.

34. The control signal generating assembly invention defined by claim 28, and wherein said sensor controller sub-assembly control signal electric/electronic circuitry generates a "true" signal only where said transverse-looking Hall-effect devices detect and indicate first and second magnetic flux sub-field densities and said first and second detected and indicated magnetic flux sub-field densities are of opposite polarity and have a difference in flux sub-field densities equal to or less than a maximum allowable deviation.

35. The control signal generating assembly invention defined by claim 29, and wherein said sensor controller sub-assembly control signal electric/electronic circuitry generates a "true" signal only where said transverse-looking Hall-effect devices detect and indicate first and second magnetic flux sub-field densities and said first and second detected and indicated magnetic flux sub-field densities are of opposite polarity and have a difference in flux sub-field densities equal to or less than a maximum allowable deviation.

36. The control signal generating assembly invention defined by claim 30, and wherein said sensor controller sub-assembly control signal electric/electronic circuitry generates a "true" signal only where said transverse-looking Hall-effect devices detect and indicate first and second magnetic flux sub-field densities and said first and second detected and indicated magnetic flux sub-field densities are of opposite polarity and have a difference in flux sub-field densities equal to or less than a maximum allowable deviation.

37. The control signal generating assembly invention defined by claim 25, and wherein said sensor controller sub-assembly control signal electric/electrical circuitry generates a "true" signal only where said transverse-looking Hall-effect devices detect and indicate first and second magnetic flux sub-field densities and said first and second detected and indicated magnetic flux sub-field densities have the same polarity and the sum of said first and second magnetic flux sub-field densities is equal to or less than a maximum allowable deviation.

38. The control signal generating assembly invention defined by claim 26, and wherein said sensor controller sub-assembly control signal electric/electrical circuitry generates a "true" signal only where said transverse-looking Hall-effect devices detect and indicate first and second magnetic flux sub-field densities and said first and second detected and indicated magnetic flux sub-field densities have the same polarity and the sum of said first and second magnetic flux sub-field densities is equal to or less than a maximum allowable deviation.

39. The control signal generating assembly invention defined by claim 27, and wherein said sensor controller sub-assembly control signal electric/electrical circuitry generates a "true" signal only where said transverse-looking Hall-effect devices detect and indicate first and second magnetic flux sub-field densities and said first and second detected and indicated magnetic flux sub-field densities have the same polarity and the sum of said first and second magnetic flux sub-field densities is equal to or less than a maximum allowable deviation.

40. The control signal generating assembly invention defined by claim 28, and wherein said sensor controller sub-assembly control signal electric/electrical circuitry generates a "true" signal only where said transverse-looking Hall-effect devices detect and indicate first and second magnetic flux sub-field densities and said first and second detected and indicated magnetic flux sub-field densities have the same polarity and the sum of said first and second magnetic flux sub-field densities is equal to or less than a maximum allowable deviation.

41. The control signal generating assembly invention defined by claim 29, and wherein said sensor controller sub-assembly control signal electric/electrical circuitry generates a "true" signal only where said transverse-looking Hall-effect devices detect and indicate first and second magnetic flux sub-field densities and said first and second detected and indicated-magnetic flux sub-field densities have the same polarity and the sum of said first and second magnetic flux sub-field densities is equal to or less than a maximum allowable deviation.

42. The control signal generating assembly invention defined by claim 30, and wherein said sensor controller sub-assembly control signal electric/electrical circuitry generates a "true" signal only where said transverse-looking Hall-effect devices detect and indicate first and second magnetic flux sub-field densities and said first and second detected and indicated magnetic flux sub-field densities have the same polarity and the sum of said first and second magnetic flux sub-field densities is equal to or less than a maximum allowable deviation.

43. The control signal generating assembly invention defined by claim 25, and wherein said sensor controller sub-assembly control signal electric/electronic circuitry generates a "false" control signal when all of said forward-looking Hall-effect devices detects and indicates a magnetic flux sub-field density below a magnetic flux sub-field density indicative that the switch point is equal to or less than a specified distance to the stock rail.

44. The control signal generating assembly defined by claim 22, and further comprising a controller sub-assembly housing having a housing body, a removable planar housing body cover, a housing body hinged interior access door, and a movable holder-clamp positioned in said housing body and securing said sensor sub-assembly in position, said holder-clamp moving said sensor sub-assembly and its array of Hall-effect devices toward the plane of said housing body cover whenever said housing access door is opened and moving said sensor sub-assembly and its array of Hall-effect devices away from the plane of said housing body cover whenever said housing access door is closed.

45. A control signal generating assembly comprising:
first and second target sub-assemblies each having an array of permanent magnets for mounting on a railroad trackwork switch assembly switch point and each generating a total magnetic flux field of unique shape and density; and
first and second, controller sub-assemblies for mounting on a railroad trackwork switch assembly stock rail, each of said first and second sub-assemblies generating railroad operating control signals, each of said first and second sub-assemblies having a sensor array of Hall-effect sensor devices aligned opposite one of said first and second target array of permanent magnets, and each of said first and second sub-assemblies having first and second control signal electric/electronic circuitry respectively controlled by said Hall-effect devices, each of said first and second control signal electric/electronic circuitries generating a "true" control signal when said Hall-effect devices sense the unique shape and strength of the total magnetic flux field of its respective target array permanent magnets indicating said switch point is sufficiently engaged in closure with said stock rail and generating a "false" control signal when both of said first and second control signal electric/electronic circuitries are not sensing the unique shape and strength of the total magnetic flux field of its target array of permanent magnets.

46. The control signal generating assembly defined by claim 45, and further comprising first and second controller sub-assembly housings, each of said first and second sub-assembly housings having a housing body, a removable planar housing body cover, a housing body hinged interior access door, and a movable holder-clamp positioned in said housing body and securing one of said controller sub-assemblies in position, said holder-clamp moving said controller sub-assembly and its array of Hall-effect devices toward the plane of said housing body cover whenever said housing access door is opened and moving said sensor sub-assembly and its array of Hall-effect devices away from the plane of said housing body cover whenever said housing access door is closed, a movable door lock for preventing simultaneous opening of both interior access doors each of said hinged interior access doors having a receiver, and said movable door lock engaging one of said first and second interior access door receivers to prevent opening thereof when said other of said first and second interior access doors is open.

47. A method for detecting if a railroad switch point is moved into a closed switch engagement with a stock rail, comprising the steps of:
providing a target sub-assembly having an array of permanent magnets carried by said switch point and generating a total magnetic flux field comprised of multiple adjacent magnetic flux sub-fields, adjacent pairs of said multiple adjacent magnetic flux sub-fields having opposite magnetic polarities;
providing a controller sub-assembly which is secured to said stock rail, which generates railroad operating control signals when said switch point is sufficiently engaged in closure with said stock rail and when said switch point is insufficiently engaged in closure with said stock rail, which has a sensor array of Hall-effect devices aligned opposite said target array of permanent magnets comprised of a row of multiple forward-looking devices with one of said forward-looking devices at the right end of said row and one of said forward-looking devices at the left end of said row and a pair of spaced-apart transverse-looking devices with each said Hall-effect device detecting and indicating the magnetic flux density and polarity of the closest magnetic flux sub-field;
determining the highest flux density magnitude of said forward-looking Hall-effect devices;
determining whether the highest flux density magnitudes of said forward-looking Hall-effect devices indicate said target is within distance limit;
calculating the maximum allowable deviation in flux-density magnitude between said right and left end forward-looking devices;
determining the flux polarity of said right and left end forward-looking devices;
determining whether the combined flux densities of said right and left end forward-looking devices are equal to or less than said maximum allowable deviation;
calculating the maximum allowable deviation in flux-density magnitude between one and the other of said pair of spaced-apart transverse-looking devices;

determining the flux polarity of said one and said other of said pair of spaced-apart transverse-looking devices;

determining whether the combined flux densities of said one and said other of said pair of spaced-apart transverse-looking devices are equal to or less than said maximum allowable deviation;

generating a railroad operating control signal indicating said switch point is sufficiently engaged in closure with said stock rail when the highest flux density magnitudes of said forward-looking devices indicate said target is within distance limits, the combined flux densities of said right and left end forward-looking devices are equal to or less than a maximum allowable deviation and the combined flux densities of said one and said other of said pair of transverse-looking devices are equal to or less than a maximum allowable deviation.

* * * * *